(12) United States Patent  
Dinter et al.

(10) Patent No.: US 7,398,489 B2
(45) Date of Patent: Jul. 8, 2008

(54) ADVANCED STANDARD CELL POWER CONNECTION

(75) Inventors: Matthias Dinter, Holzkirchen (DE); Juergen Dirks, Holzkirchen (DE); Herbert Johannes Preuthen, Groebenzell (DE)

(73) Assignee: LSI Corporation, Milpitas, CA (US)

( * ) Notice: Subject to any disclaimer, the term of this patent is extended or adjusted under 35 U.S.C. 154(b) by 400 days.

(21) Appl. No.: 11/100,986

(22) Filed: Apr. 6, 2005

(65) Prior Publication Data

US 2006/0226530 A1 Oct. 12, 2006

(51) Int. Cl.
*G06F 17/50* (2006.01)
(52) U.S. Cl. .............................. 716/4; 716/5
(58) Field of Classification Search ............ 716/1, 716/2, 4, 5, 8–14
See application file for complete search history.

(56) References Cited

U.S. PATENT DOCUMENTS

| 6,904,575 | B2 * | 6/2005 | Allen et al. ............ 716/4 |
| 7,003,748 | B1 * | 2/2006 | Hsu ..................... 716/8 |
| 7,016,794 | B2 * | 3/2006 | Schultz ................. 702/64 |
| 7,107,561 | B2 * | 9/2006 | Ali et al. ............... 716/10 |
| 2004/0143797 | A1 * | 7/2004 | Nguyen et al. .......... 716/1 |
| 2005/0276132 | A1 * | 12/2005 | Severson et al. ........ 365/202 |

* cited by examiner

*Primary Examiner*—Vuthe Siek
(74) *Attorney, Agent, or Firm*—Christopher P. Maiorana, PC

(57) ABSTRACT

A method for establishing standard cell power connections is disclosed. The method generally includes the steps of (A) calculating a power consumption of a plurality of logic cells receiving power directly from a power rail, (B) removing at least one excess via from a plurality of vias directly connecting the power rail to a power mesh in response to the power consumption and (C) routing a signal through an area where the at least one excess via was removed.

21 Claims, 4 Drawing Sheets

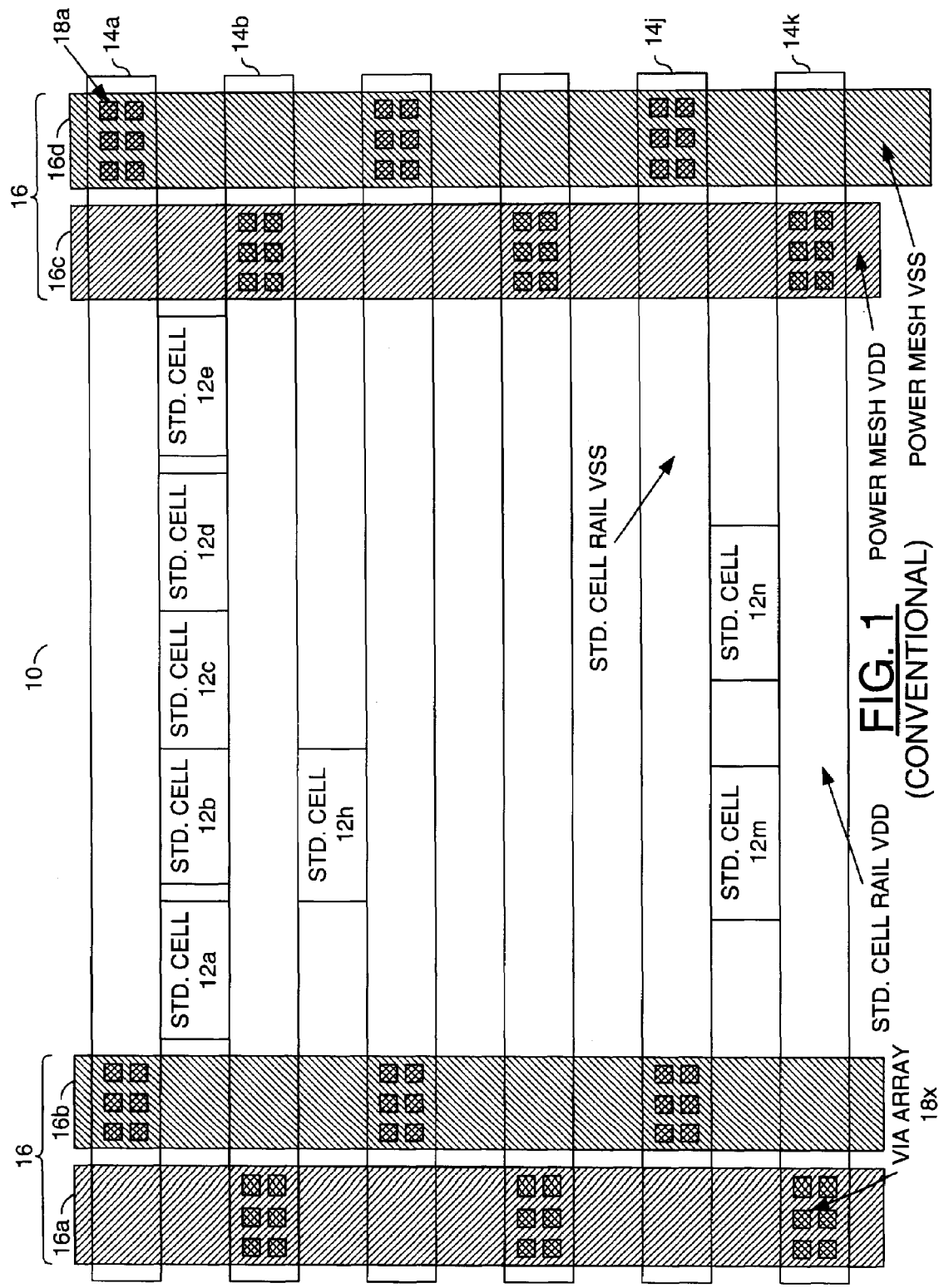
FIG. 1
(CONVENTIONAL)

US 7,398,489 B2

1
ADVANCED STANDARD CELL POWER CONNECTION

FIELD OF THE INVENTION

The present invention relates to computer automated circuit design generally and, more particularly, to an advanced standard cell power connection technique.

BACKGROUND OF THE INVENTION

Referring to FIG. 1, a diagram of a conventional layout 10 for an application specific integrated circuit (ASIC) is shown. Generation of the conventional layout 10 involves placing and routing numerous standard cells 12a-12n. Power is provided to the standard cells 12a-12n by way of a horizontal series of power rails 14a-14k. Every other power rail 14a-14k alternatively carries a power and a ground. Electrical power is distributed to the rails 14a-14k by a power mesh 16. The power mesh 16 conventionally forms a series of vertical power mesh routes 16a-16d. Every other power mesh route 16a-16d alternatively carries the power and the ground. Via arrays 18a-18x connect the power rails 14a-14k to the appropriate power mesh routes 16a-16d.

An individual via size and a number of vias in the arrays 18a-18x connecting the power rails 14a-14k up to the power mesh routes 16a-16d is conventionally calculated by a tool based on an overall current flow (i.e., electromigration requirements or current density limits). As a result, the via size and the number of vias in the via arrays 18a-18x is the same over the entire circuit layout. The tool does not consider a number or kind of cells 12a-12n in each specific row segment or how much power is really used in the row segment. As shown in FIG. 1, different numbers of standard cells 12a-12n are placed in different row segments between pairs of power mesh routes 16a-16d. However, the via arrays 18a-18x connecting the power mesh routes 16a-16d to the power rails 14a-14k are all the same.

The volume occupied by the vias between the power rails 14a-14k up to the power mesh routes 16a-16d block routing channels in all metal layers that the vias intersect. Routing resources are wasted because regions of low standard cell density use less power than regions of high standard cell density. After automatic routing has been completed, unnecessary vias in the via arrays 18a-18x that were initially inserted to handle a maximum current flow are conventionally removed manually by design engineers. The design engineers can also manually reduce the vias in congested areas, but removing the vias can cause IR-drops and electromigration problems. Checking for IR-drop problems and electromigration problems is usually done later in a conventional design flow.

SUMMARY OF THE INVENTION

The present invention concerns a method for establishing standard cell power connections. The method generally comprises the steps of (A) calculating a power consumption of a plurality of logic cells receiving power directly from a power rail, (B) removing at least one excess via from a plurality of vias directly connecting the power rail to a power mesh in response to the power consumption and (C) routing a signal through an area where the at least one excess via was removed.

The objects, features and advantages of the present invention include providing an advanced standard cell power connection technique that may (i) help reduce routing conges- 2
tion, (ii) improve or ease signal routing constraints, (iii) shorten turnaround time and/or (iv) reduce or eliminate manually introduced mistakes compared with conventional procedures.

BRIEF DESCRIPTION OF THE DRAWINGS

These and other objects, features and advantages of the present invention will be apparent from the following detailed description and the appended claims and drawings in which:

FIG. 1 is a diagram of a conventional layout for an application specific integrated circuit;

DETAILED DESCRIPTION OF THE PREFERRED EMBODIMENTS

The present invention generally connects multiple standard cells in an intelligent way to a power mesh. The intelligent connections may control placement of electrical power carrying conductors to free up routing channels in areas where a power demand is low. The control may be achieved by adjusting a number of vias in each via array connecting power rails to the power mesh early in layout development.

Figure 2:
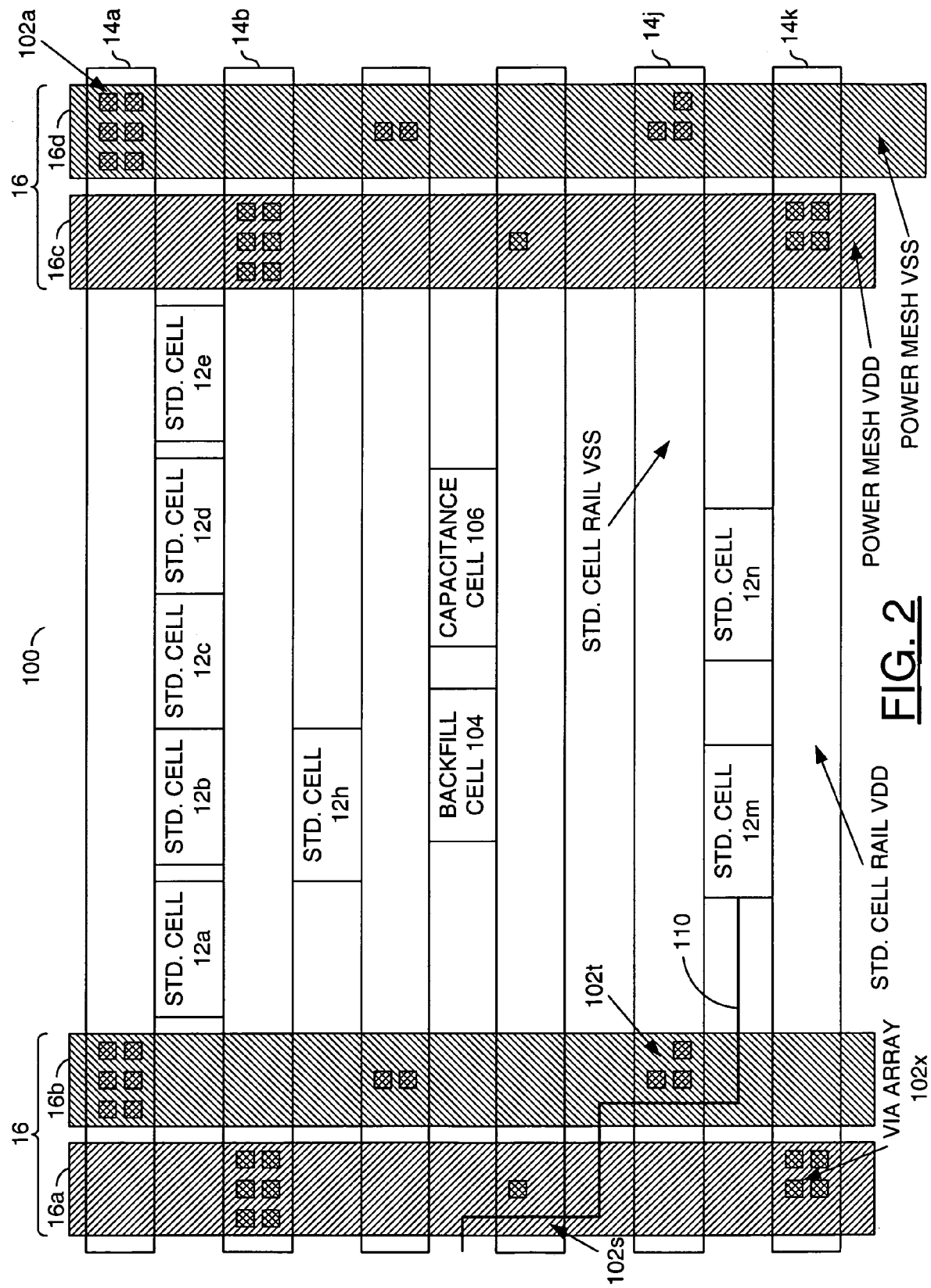
FIG. 2 is a block diagram of an example circuit layout in accordance with a preferred embodiment of the present invention.

Referring to FIG. 2, a block diagram of an example circuit layout 100 is shown in accordance with a preferred embodiment of the present invention. The circuit layout 100 generally comprises multiple standard cells 12a-12n, multiple power rails 14a-14k, a power mesh 16, multiple via arrays 102a-102x, zero or more optional backfill cells 104 and zero or more optional capacitance cells 106. The circuit layout 100 may define an electronic circuit (or system) fabricated on (in) a semiconductor substrate.

Each standard cell 12a-12n may be a standard library cell. In some instances, one or more of the cells 12a-12n may have a custom design. The standard cells 12a-12n may also be referred to as logic cells. The standard cells 12a-12n are generally disposed in the circuit layout 100 between the power rails 14a-14k. Each standard cell 12a-12n may be connected to one of the power rails 14a-14k carrying a first power (e.g., VSS) and one of the power rails 14a-14k carrying a second power (e.g., VDD). A finite number of the standard cells 12a-12n may be disposed along the power rail segments between the power mesh routes 16a-16d.

The backfill cells 104 may be nonfunctional cells designed to improve fabrication yields. The backfill cells 104 may be placed in areas of the circuit layout 100 not occupied by a standard cell 12a-12n. The backfill cells 104 may or may not include connections to the power rails 14a-14k.

The capacitance cells 106 may be operational to provide capacitive filtering of the electrical power. The capacitance cells 106 may be placed and routed in areas of the circuit layout 100 not occupied by a standard cell 12a-12n and not reserved for future cell placements. Each of the capacitance cells 106 generally connects between power rails 14a-14k of opposite polarity.

Each power rail 14a-14k may be fabricated from one or more layers of a conductive material (e.g., metal or polysilicon). The power rails 14a-14k may be generally oriented parallel to each other. A spacing between neighboring power rails 14a-14k may be sufficiently wide to accommodate a widest standard cell 12a-12n. Every other power rail 14a-14k may alternatively carry the first power VSS and the second power VDD.

The power mesh 16 generally comprises multiple power mesh routes 16a-16d. Each power mesh route 16a-16d may be fabricated from one or more layers of a conductive material (e.g., metal). The power mesh routes 16a-16d may be generally oriented parallel to each other and orthogonal to the power rails 14a-14k. Every other power mesh route 16a-16d may alternatively carry the first power VSS and the second power VDD.

Each via array 102a-102x may contain a calculated number of individual vias 108. Generally, the number of vias 108 in any given via array 102a-102x varies between a minimum number (e.g., one) of vias 108 to a predetermined maximum number (e.g., six) of vias 108. Other minimum number and/or maximum number of vias 108 may be implemented to meet a criteria of a particular application. A criteria for the minimum number of vias 108 may be a yield limitation for a given technology. The present invention generally does not impact a manufacturing yield. Therefore, the minimum number of vias 108 may be greater than one.

Calculating the number of vias 108 for each of the arrays 102a-102x may be performed by a software tool. The software tool may be operational to read (i) placement information and (ii) either power consumption information or current consumption information of the standard cells 12a-12n disposed between two of the power mesh routes 16a-16d. The software tool may be configured to read design libraries that include technology design rules for yield and reliability. The software tool may also be operational to calculate a suitable size for each via array 102a-102x.

The via array calculations generally predict a power drop, a voltage drop, an electromigration effect of the current and/or current density flowing through each via array 102a-102x. Based on the calculations for each individual row segment of the power rails 14a-14k, the software tool may determine an appropriate number of vias 108 in the respective via arrays 102a-102x. To allow later placement of cells caused by engineering change orders (ECOs) or decoupling capacitance, one or more margins (e.g., power consumption) may be included into the via calculation. The arrays 102a-102x containing fewer vias 108 for power rail segments that provide power for fewer standard cells 12a-12n are generally shown in FIG. 2. Since the present invention may provide fewer vias 108 going through all fabrication layers between the power rails 14a-14k and the power mesh 16, more routing resources (e.g., area) may be free to improve signal routing. For example, a signal trace 110 may be routed through a reduced via array 102s and a reduced via array 102t passing through the areas where vias 108 have been removed.

Figure 3:
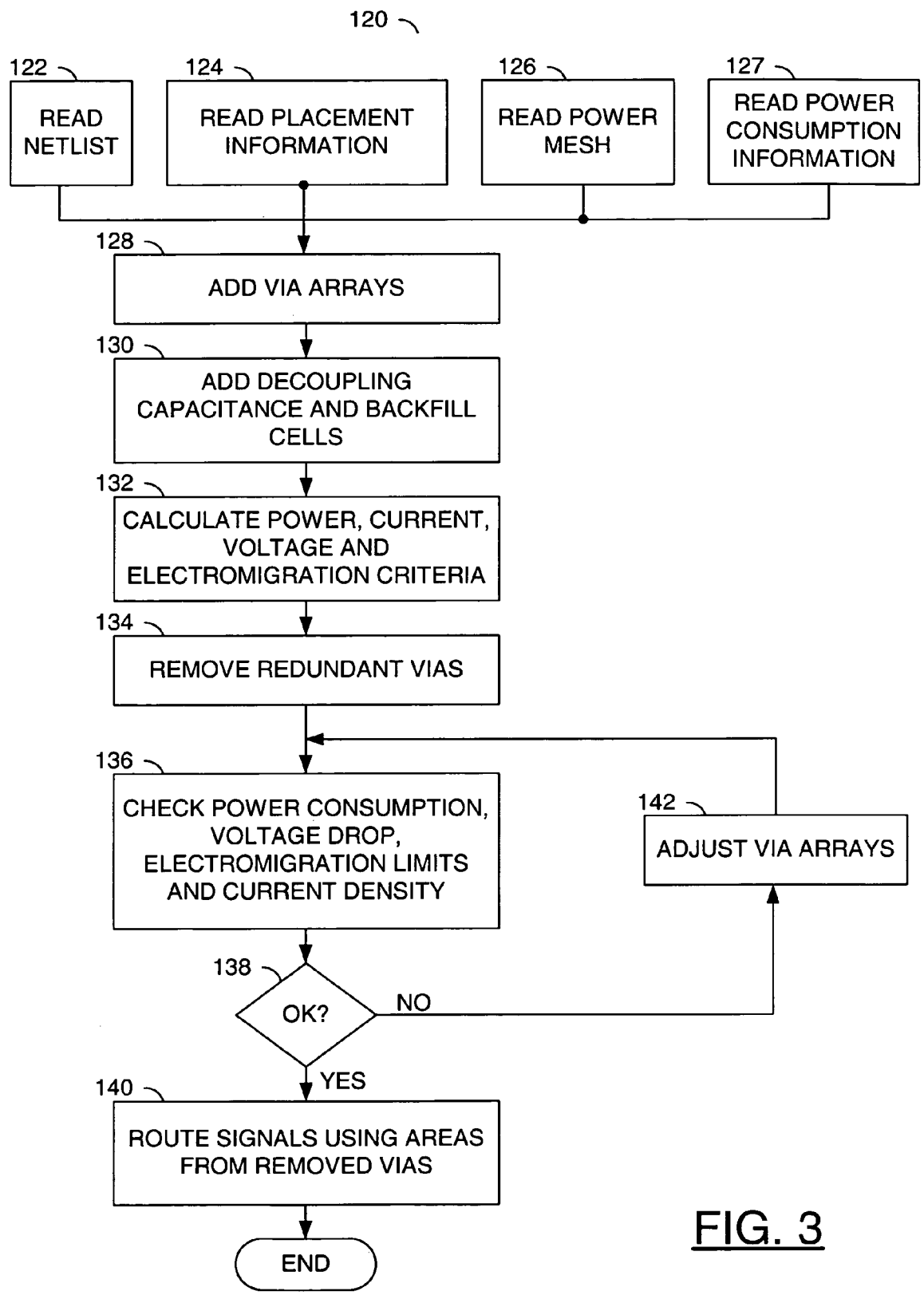
FIG. 3 is a block diagram of an example process flow.

Referring to FIG. 3, a block diagram of an example process flow 120 is shown. The process flow (or method) 120 generally comprises a step (or block) 122, a step (or block) 124, a step (or block) 126, a step (or block) 127, a step (or block) 128, a step (or block) 130, a step (or block) 132, a step (or block) 134, a step (or block) 136, a step (or block) 138, a step (or block) 140 and a step (or block) 142. The process flow 120 may be implemented in the software tool.

Areas of high standard cell utilization may be identified and provided with a full amount of vias 108 to connect the standard cell power rails 14a-14k with the power mesh 16. Areas of lower power consumption (e.g., due to fewer placed cells, cells running at lower frequency, etc.) and/or electromigration impact generally receive less than the full mount of vias 108 in the associated via arrays 102a-102x. Removing the excess vias 108 may free up routing resources (e.g., area on each layer between the power rails 14a-14k and the power mesh 16) for signal routing.

The process flow 120 generally begins by reading (i) a netlist of a circuit design in the step 122, (ii) placement information for the circuit layout (e.g., 100) in the step 124, (iii) power mesh information in the step 126 and (iv) power consumption information in the step 127. Via arrays 102a-102x may be added to the circuit layout in each area where the power rails 14a-14k cross a power mesh route 16a-16d in step 128. Each of the via arrays 102a-102x may have an initial allocation of a predetermined number (e.g., a maximum number) of vias 108. In the step 130, backfill cells 106 and decoupling capacitance cells 104 may be added to the circuit layout.

One or more calculations may be performed in the step 132 to determine a proper number of vias 108 that may be kept in each of the via arrays 102a-102x. The calculations may be based on one or more of (i) the power consumption, (ii) the current consumption, (iii) voltage drop and (iv) the electromigration criteria for the standard cells 12a-12n disposed in the power rail segments proximate the via array 102a-120x under consideration. The calculations may add one or more margins to the power consumption, the current consumption, the voltage drop and/or the electromigration criteria. The calculations may determine that some of the via arrays 102a-102x may have an excessive number of the vias 108. As such, the process flow 120 may remove one or more excess vias 108 in the step 134. However, at least one via, or a minimum number of vias 108 determined by a design rule for yield, should be left in each of the via arrays 102a-102x.

The margins may be determined by the design engineers. The margins may include an upper bound (e.g., a maximum number of vias 108 in any given via array 102a-102x). The margins may include a lower bound (e.g., at least one via 108 in each via array 102a-102x). Where a power rail segment is completely full of standard cells 12a-12n, the margin may be zero (e.g., no power growth as no physical growth may be practical).

One or more checks may be performed on each of the via arrays 102a-102x (or at least the via arrays where one or more vias 108 where removed) in the step 136. The checks may calculate a power consumption, a current density through the remaining vias 108, a voltage drop across the vias 108 between the power mesh routes 16a-16d and the power rails 14a-14k, an electromigration limit caused by a calculated current flow through each of the vias 108 and/or a current density through the remaining vias 108.

If the current density for a given technology is proximate a target density threshold, the voltage drop is proximate a target voltage threshold, the power consumption is proximate a target maximum consumption and/or the electromigration limit is proximate a target threshold (e.g., the YES branch of decision step 138, the process flow 120 may continue with the step 140. In the step 140, automatic signal routing may be performed. The signal routing may result in traces (e.g., 110) passing through the areas where vias 108 were removed in the step 134. As such, the present invention generally provides increased usable area in one or more layers for routing signals.

If one or more of the current density, voltage drop, power consumption and/or electromigration limit is determined to be distant from the respective threshold (e.g., the NO branch of step 138), the process flow 120 may adjust the via array 102a-102x in the step 142. "Distant" generally means that plenty of margin exists, or a significant distance may exist until the technology limits are reached. The adjustment generally means removing one or more additional vias 108 from the array 102a-102x. After the additional removal has completed, the process flow 120 may return to the step 136 to recheck the power consumption, current density, voltage drop and/or electromigration limit.

A "distant" power consumption may be defined as the calculated power consumption far below the technology limits for a particular current density and/or electromigration limits. A "distant" voltage drop may be defined as the calculated voltage drop far below a maximum voltage threshold. A "distant" electromigration may be defined as a maximum current density a line may carry before the current flow impacts the reliability of the metal line. The reliability may concern the lifetime of the chip and/or an increase in resistance due to the electromigration effects. A formula for calculating the minimum number of vias 108 for a particular via array may be provided as follows:

$$\text{minimum number of vias} = \text{MAX}\left\{\frac{a}{aa}, \frac{b}{bb}; \frac{c}{cc}, d\right\}$$

where the MAX function returns the largest among the four values within the brackets, "a" may be a current flow through the particular via array, "aa" may be a current limit for a single via of the particular via array, "b" may be a resistance of the particular via array, "bb" may be the maximum allowed resistance of the particular via array, "c" may be an IR drop across the particular via array, "cc" may be the maximum allowed IR drop for the particular via array and "d" may be a minimum number of vias for the given technology that comes from the yield criteria for manufacturing.

In one embodiment, the adjustment step 142 may include adding vias 108 back into the appropriate via array 102a-102x. For example, the check performed in step 136 may determine that the power consumption, voltage drop, current density and/or electromigration limit is too close to the respective threshold in a particular direction (e.g., the consumption, drop, density or rate is larger than the respective threshold). Therefore, the restored vias 108 may reduce the particular effects that caused the step 138 to fail (e.g., the NO branch).

Figure 4:
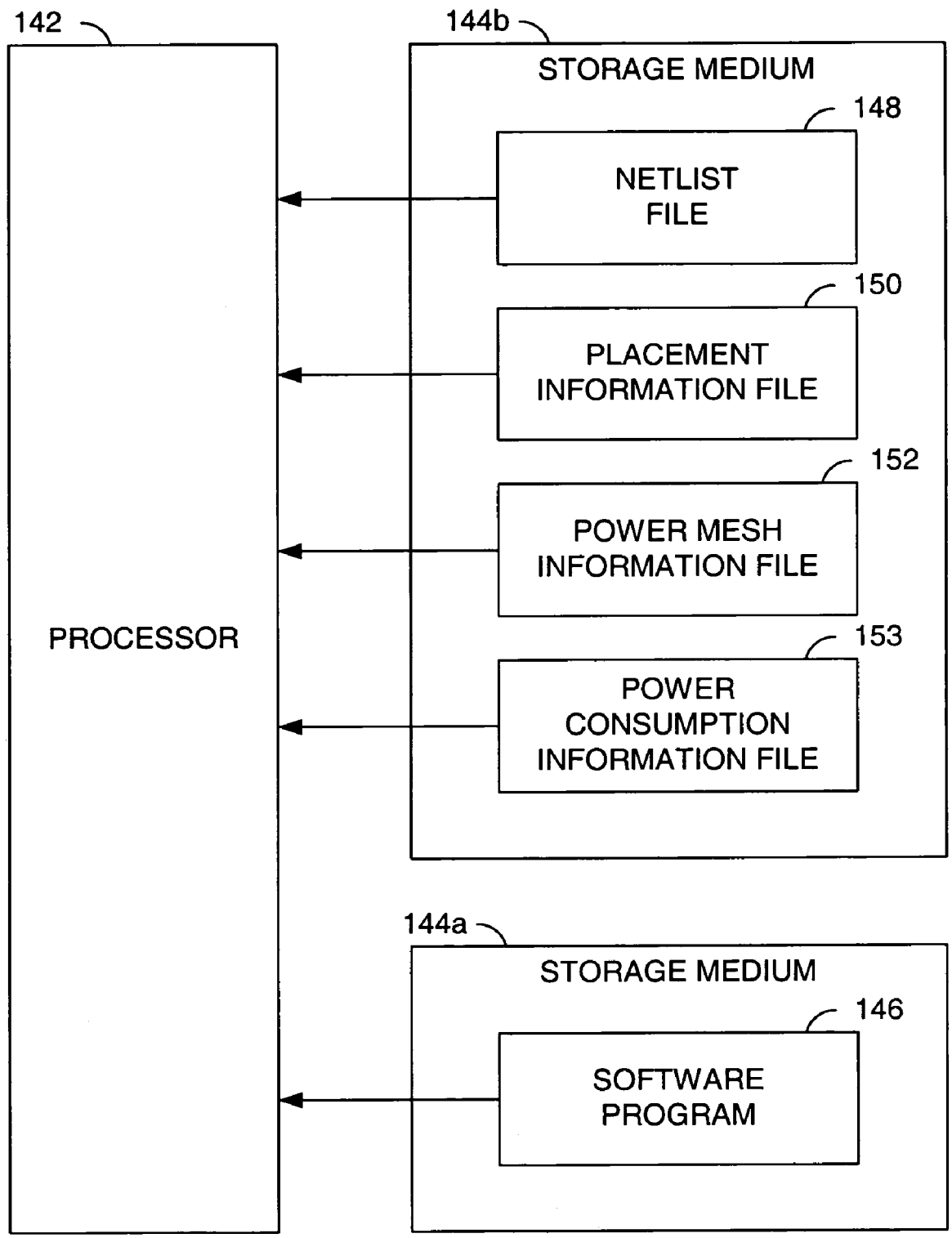
FIG. 4 is a block diagram of an example implementation of a system.

Referring to FIG. 4, a block diagram of an example implementation of a system 140 is shown. The system (or circuit) may be implemented as a computer system executing software programmed in accordance with the present invention. The computer system 140 generally comprises a processor 142 and one or more storage media 144a-144b. The processor 142 may be operational to execute a software program (e.g., the software tool) stored in the storage media 144a-144b to calculate, remove and adjust the number of vias 108 in the via arrays 102a-102x. The processor 142 may be configured to access both the storage media 144a-144b substantially simultaneously.

The storage medium 144a may be configured as a removable storage device or network connection accessible to the processor 142. The storage medium 144a may store or transfer a software program 146. The processor 142 may read and execute the software program 146 to perform the steps of the process flow 120.

The storage medium 144b may be configured as a mass storage device accessible to the processor 142, such as a magnetic hard drive. The storage medium 144b may store a netlist file 148, a placement information file 150, a power mesh information file 152 and a power consumption information file 153. The processor 142 may read the information from the files 148-153 as input to the process flow 120.

In one embodiment, the storage media 144a and 144b may be a single storage medium. In another embodiment, the software program 146 may be presented to the system 100 from the storage medium 144a, then copied to and executed from the storage medium 144b. Other media and file arrangements may be implemented to meet the criteria of a particular application.

The function performed by the flow diagram of FIG. 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMS, EPROMS, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for establishing standard cell power connections, comprising the steps of:
    (A) calculating a current density through each of a plurality of vias directly connecting a power rail to a power mesh, wherein said current density is due to a plurality of logic cells receiving power directly from said power rail;
    (B) removing at least one excess via of said vias in response to said current density without modifying said power mesh;
    (C) routing a signal through an area where said at least one excess via was removed;
    (D) calculating a voltage drop across said vias after said removing said at least one excess via;
    (E) adjusting a number of said vias in response to said voltage drop; and
    (F) recalculating said voltage drop across said vias after said adjusting said number of said vias.

2. The method according to claim 1, further comprising the step of:
    calculating an electromigration effect caused by said logic cells, wherein said removing said at least one excess via is in further response to said electromigration effect.

3. The method according to claim 1, further comprising the step of:
    placing a predetermined number of said vias between said power rail and said power mesh prior to calculating said current density.

4. The method according to claim 1, further comprising the step of:
   connecting a decoupling capacitance cell to said power rail prior to calculating said current density.

5. A method for establishing standard cell power connections, comprising the steps of:
   (A) calculating a power consumption of a plurality of logic cells receiving power directly from a power rail;
   (B) removing at least one excess via from a plurality of vias directly connecting said power rail to a power mesh in response to said power consumption;
   (C) routing a signal through an area where said at least one excess via was removed;
   (D) calculating an electromigration effect after said removing said at least one excess via; and
   (E) adjusting a number of said vias in response said electromigration effect as calculated, wherein said adjusting comprises increasing said number of said vias in response to said electromigration effect exceeding a threshold.

6. The method according to claim 5, further comprising the step of:
   calculating a voltage drop between said power mesh and said power rail after said removing said at least one excess via.

7. The method according to claim 6, further comprising the steps of:
   adjusting said number of said vias in response said voltage drop; and
   recalculating said voltage drop across said vias after said adjusting said number of said vias.

8. The method according to claim 5, further comprising the step of:
   adding a margin to said power consumption prior to said removing.

9. The method according to claim 5, further comprising the step of:
   calculating a current density through said vias, wherein said removing said at least one excess via is in further response to said current density.

10. The method according to claim 5, further comprising the step of:
    calculating an electromigration effect due to a current flow through said vias, wherein said removing said at least one excess via is in further response to said electromigration effect.

11. The method according to claim 5, further comprising a storage medium recording a computer program comprising the steps of claim 5.

12. A method for establishing standard cell power connections, comprising the steps of:
    (A) calculating an electromigration effect for each of a plurality of vias directly connecting a power rail to a power mesh, wherein said electromigration effect is due to a plurality of logic cells receiving power directly from said power rail;
    (B) removing at least one excess via of said vias in response to said electromigration effect;
    (C) routing a signal through an area where said at least one excess via was removed;
    (D) recalculating said electromigration effect after said removing said at least one excess via; and
    (E) adjusting a number of said vias in response said electromigration effect as recalculated, wherein said adjusting comprises increasing said number of said vias in response to said electromigration effect exceeding a threshold.

13. The method according to claim 12, further comprising the step of:
    calculating a power consumption for said logic cells, wherein said removing said at least one excess via is in further response to said power consumption.

14. The method according to claim 12, further comprising the steps of:
    calculating a current density through said vias after said removing said at least one excess via; and
    adjusting said number of vias in response to said current density.

15. The method according to claim 12, further comprising a storage medium recording a computer program comprising the steps of claim 12.

16. A method for establishing standard cell power connections, comprising the steps of:
    (A) calculating an electromigration effect for each of a plurality of vias directly connecting a power rail to a power mesh, wherein said electromigration effect is due to a plurality of logic cells receiving power directly from said power rail;
    (B) removing at least one excess via of said vias in response to said electromigration effect;
    (C) routing a signal through an area where said at least one excess via was removed;
    (D) calculating a power consumption for said logic cells, wherein said removing said at least one excess via is in further response to said power consumption;
    (E) calculating a current density through said vias after said removing said at least one excess via;
    (F) calculating a voltage drop across said vias after said removing said at least one excess via; and
    (G) adjusting a number of said vias in response to both (E) said current density and (F) said voltage drop.

17. The method according to claim 16, further comprising the step of:
    recalculating said electromigration effect after said removing said at least one excess via.

18. The method according to claim 17, further comprising the step of:
    adjusting said number of said vias in response said electromigration effect as recalculated.

19. The method according to claim 18, wherein said adjusting step in claim 18 comprises the sub-step of:
    decreasing said number of said vias in response to a threshold exceeding said electromigration effect.

20. The method according to claim 17, further comprising the step of:
    increasing said number of said vias in response to said electromigration effect as recalculated exceeding a threshold.

21. A method for establishing standard cell power connections, comprising the steps of:
    (A) calculating a current density through each of a plurality of vias directly connecting a power rail to a power mesh, wherein said current density is due to a plurality of logic cells receiving power directly from said power rail;
    (B) removing at least one excess via of said vias in response to said current density;
    (C) routing a signal through an area where said at least one excess via was removed;
    (D) calculating a voltage drop across said vias after said removing said at least one excess via;
    (E) adjusting a number of said vias in response to said voltage drop; and
    (F) recalculating said voltage drop across said vias after said adjusting said number of said vias.

* * * * *